US012588288B2

(12) United States Patent
Lu et al.

(10) Patent No.: US 12,588,288 B2
(45) Date of Patent: Mar. 24, 2026

(54) ACTIVE DEVICE SUBSTRATE

(71) Applicant: AUO Corporation, Hsinchu (TW)

(72) Inventors: Chia-Yang Lu, Hsinchu (TW); Pei-Yun Wang, Hsinchu (TW)

(73) Assignee: AUO Corporation, Hsinchu (TW)

( * ) Notice: Subject to any disclaimer, the term of this patent is extended or adjusted under 35 U.S.C. 154(b) by 401 days.

(21) Appl. No.: 18/091,383

(22) Filed: Dec. 30, 2022

(65) Prior Publication Data

US 2024/0213264 A1      Jun. 27, 2024

(30) Foreign Application Priority Data

Dec. 26, 2022    (CN) .......................... 202211679373.7

(51) Int. Cl.
| | |
|---|---|
| *H10D 86/60* | (2025.01) |
| *H01L 25/075* | (2006.01) |
| *H10D 30/67* | (2025.01) |
| *H10D 86/40* | (2025.01) |
| *H10H 20/855* | (2025.01) |
| *H10H 20/857* | (2025.01) |

(52) U.S. Cl.
CPC ......... *H10D 86/60* (2025.01); *H01L 25/0753* (2013.01); *H10D 30/6734* (2025.01); *H10D 86/441* (2025.01); *H10D 86/481* (2025.01); *H10H 20/855* (2025.01); *H10H 20/857* (2025.01)

(58) Field of Classification Search
CPC ............ H01L 25/0753; H10D 30/6734; H10D 86/423; H10D 86/441; H10D 86/481; H10D 86/60
See application file for complete search history.

(56) References Cited

U.S. PATENT DOCUMENTS

| | | |
|---|---|---|
| 2017/0294497 A1 | 10/2017 | Lius et al. |
| 2021/0210587 A1 | 7/2021 | Zhu et al. |
| 2022/0320245 A1 | 10/2022 | Qu et al. |

FOREIGN PATENT DOCUMENTS

| | | | |
|---|---|---|---|
| CN | 107275367 A | | 10/2017 |
| CN | 108806593 | * | 11/2018 |
| CN | 113394237 | | 9/2021 |
| CN | 114360448 | | 4/2022 |

* cited by examiner

*Primary Examiner* — Tony Tran
(74) *Attorney, Agent, or Firm* — JCIPRNET

(57) ABSTRACT

An active device substrate including a substrate, a transfer wire, a first insulating layer, a second insulating layer, a first semiconductor pattern, a second semiconductor pattern, a first connection structure, a second connection structure, a first gate, a second gate, a third insulating layer, a first source/drain, and a second source/drain is provided. The first insulating layer is located above the transfer wire. The second insulating layer is located above the first insulating layer. The first semiconductor pattern and the second semiconductor pattern are located between the first insulating layer and the second insulating layer. The first connection structure and the second connection structure are located above the second insulating layer and electrically connected to the transfer wire. The first gate and the second gate respectively overlap the first semiconductor pattern and the second semiconductor pattern.

9 Claims, 13 Drawing Sheets

$$210 \begin{cases} 212 \\ 214 \end{cases} \quad 230 \begin{cases} 231 \\ 232 \\ 233 \\ 236 \end{cases} \quad 240 \begin{cases} 242 \\ 244 \\ 246 \end{cases} \quad 250 \begin{cases} 251 \\ 252 \\ 253 \\ 254 \\ 255 \\ 256 \end{cases}$$

30

$210 \begin{cases} 212 \\ 214 \end{cases}$   $230 \begin{cases} 231 \\ 232 \\ 233 \\ 236 \\ 237 \end{cases}$   $240 \begin{cases} 242 \\ 244 \\ 246 \end{cases}$   $250 \begin{cases} 251 \\ 252 \\ 253 \\ 254 \\ 255 \\ 256 \end{cases}$

50

ACTIVE DEVICE SUBSTRATE

CROSS-REFERENCE TO RELATED APPLICATION

This application claims the priority benefit of China application serial no. 202211679373.7, filed on Dec. 26, 2022. The entirety of the above-mentioned patent application is hereby incorporated by reference herein and made a part of this specification.

BACKGROUND

Technical Field

The disclosure relates to an active device substrate.

Description of Related Art

Micro light-emitting diode (micro-LED) is an electroluminescent semiconductor device, which has the advantages of long lifetime, unbreakable, fast response, and high reliability. Generally, in micro light-emitting diode display apparatus, a large number of micro light-emitting diodes are transferred to a pixel array substrate, and the active devices in the pixel array substrate are used to control the micro light-emitting diodes to be powered on or off.

SUMMARY

The disclosure provides an active device substrate that relieves the problem of IR drop.

At least one embodiment of the disclosure provides an active device substrate. The active device substrate includes a substrate, a transfer wire, a first insulating layer, a second insulating layer, a first semiconductor pattern, a second semiconductor pattern, a first connection structure, a second connection structure, a first gate, a second gate, a third insulating layer, a first source/drain, and a second source/drain. The transfer wire is located above the substrate. The first insulating layer is located above the transfer wire. The second insulating layer is located above the first insulating layer. The first semiconductor pattern and the second semiconductor pattern are located between the first insulating layer and the second insulating layer. The first connection structure and the second connection structure are located above the second insulating layer and are respectively filled into a first via and a second via that run through the first insulating layer and the second insulating layer to electrically connect to the transfer wire. The first gate and the second gate respectively overlap the first semiconductor pattern and the second semiconductor pattern. The third insulating layer is located above the first connection structure, the second connection structure, and the second insulating layer. The first source/drain and the second source/drain are located above the third insulating layer and electrically connect to the first semiconductor pattern and the second semiconductor pattern, respectively.

DESCRIPTION OF THE EMBODIMENTS

Figure 1A:
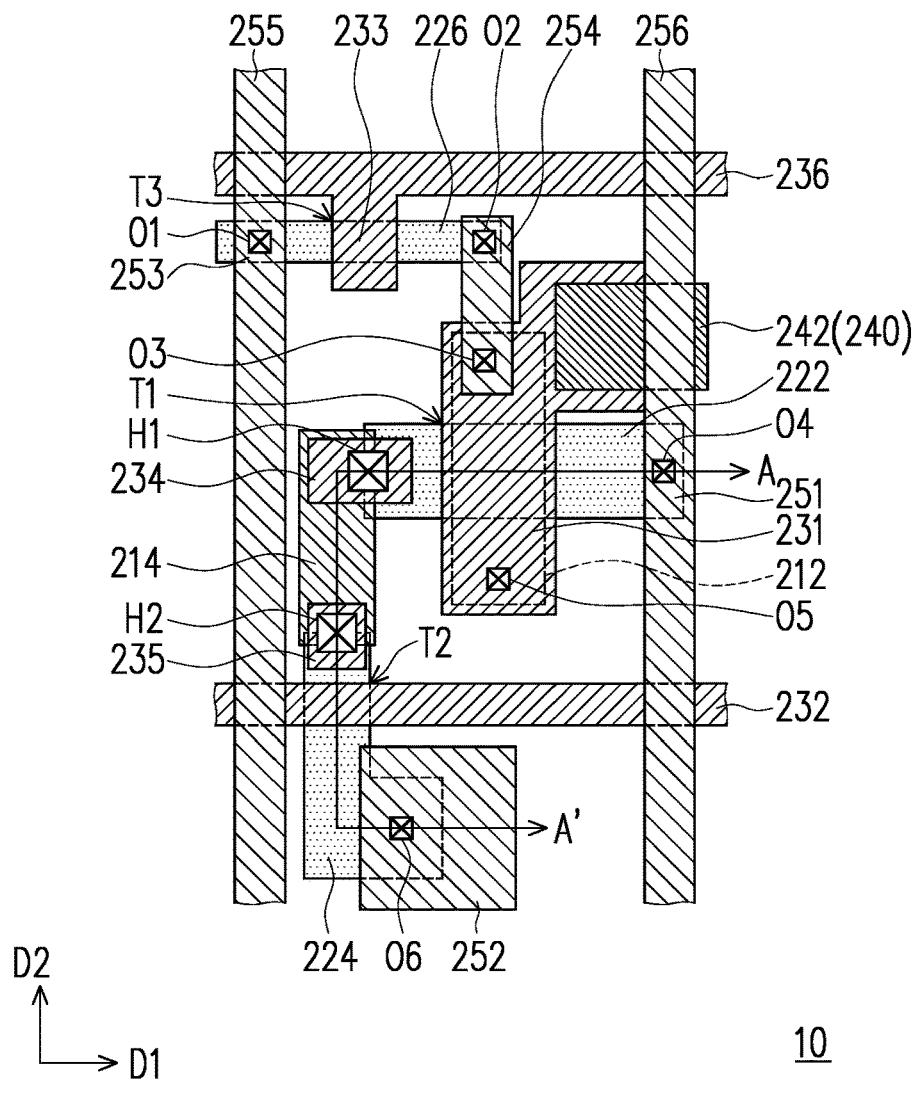
FIG. 1A is a schematic top view of an active device substrate according to an embodiment of the disclosure.
Figure 1B:
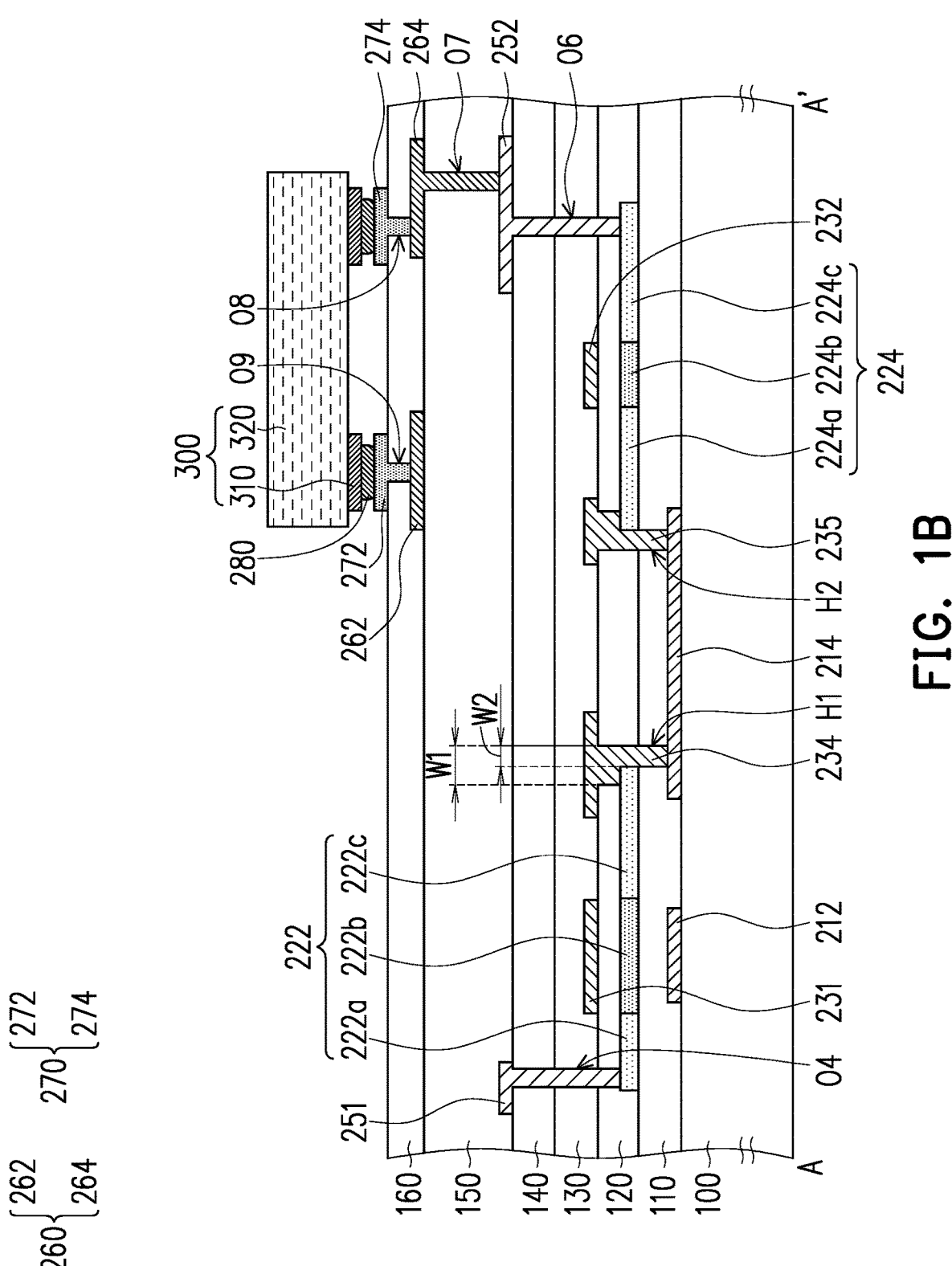
FIG. 1B is a cross-sectional schematic view along a line A-A' of FIG. 1A.

FIG. 1A is a schematic top view of an active device substrate 10 according to an embodiment of the disclosure. FIG. 1B is a cross-sectional schematic view along a line A-A' of FIG. 1A. It should be noted that, for the convenience of illustration, FIG. 1A shows a first conductive layer 210, a first semiconductor pattern 222, a second semiconductor pattern 224, a third semiconductor pattern 226, a second conductive layer 230, a third conductive layer 240, and a fourth conductive layer 250, omitting other components.

Referring to FIG. 1A and FIG. 1B, the active device substrate 10 includes a substrate 100, a transfer wire 214, a first insulating layer 110, a second insulating layer 120, a first semiconductor pattern 222, a second semiconductor pattern 224, a first gate 231, a second gate 232, a first connection structure 234, a second connection structure 235, a third insulating layer 130, a first source/drain 251, and a second source/drain 252. In this embodiment, the active device substrate 10 further includes a first bottom gate 212, a third semiconductor pattern 226, a third gate 233, a scanning line 236, a capacitive electrode 242, a fourth insulating layer 140, a third source/drain 253, a fourth source/drain 254, a data line 255, a working voltage line 256, a fifth conductive layer 260, a sixth conductive layer 270, a conductive connection structure 280, and a light-emitting diode 300.

The substrate 100 is, for example, a rigid substrate, and the material thereof is glass, quartz, organic polymer, opaque/reflective material (e.g., conductive material, metal, wafer, ceramic, or other applicable material), or other suitable materials. However, the disclosure is not limited thereto. In other embodiments, the substrate 100 may also be a flexible substrate or a stretchable substrate. For example, materials of the flexible substrates and the stretchable substrates include polyimide (PI), polydimethylsiloxane (PDMS), polyethylene terephthalate (PET), polyethylene naphthalate (PEN), polyester (PES), polymethylmethacrylate (PMMA), polycarbonate (PC), polyurethane (PU), or other suitable materials.

The first conductive layer 210 is located above the substrate 100 and includes the first bottom gate 212 and the transfer wire 214. The first conductive layer 210 includes a single-layer or multi-layer structure, and the material of the first conductive layer 210 includes, for example, chromium, gold, silver, copper, tin, lead, hafnium, tungsten, molybdenum, neodymium, titanium, tantalum, aluminum, zinc, nickel, alloy or stacked layers of the above metals, nitride of the above metals, or other low resistance metal materials. In some embodiments, the method for forming the first conductive layer 210 includes: depositing a first conductive material layer entirely on the substrate 100, and then patterning the aforementioned first conductive material layer through a photolithographic process and an etching process, thereby forming the first conductive layer 210. In some embodiments, the thickness of the first conductive layer 210 is 20 nanometers to 500 nanometers.

In this embodiment, the first conductive layer 210 is directly formed on the substrate 100, but the disclosure is not limited thereto. In other embodiments, other insulating layers or cushioning layers are included between the first conductive layer 210 and the substrate 100.

The first insulating layer 110 is located above the first conductive layer 210, and the first conductive layer 210 is located between the substrate 100 and the first insulating layer 110. In this embodiment, the first insulating layer 110 is located above the first bottom gate 212 and the transfer wire 214. In some embodiments, the first insulating layer 110 is formed by physical vapor deposition, chemical vapor deposition, or other suitable processes. In some embodiments, the material of the first insulating layer 110 includes silicon oxide, silicon nitride, silicon oxynitride, aluminum oxide, zirconium oxide, hafnium oxide, or other suitable materials. In some embodiments, the thickness of the first insulating layer 110 is 50 nanometers to 500 nanometers.

The first semiconductor pattern 222, the second semiconductor pattern 224, and the third semiconductor pattern 226 are located above the first insulating layer 110. Each of the first semiconductor pattern 222, the second semiconductor pattern 224, and the third semiconductor pattern 226 is a single-layer or multi-layer structure, and the materials thereof include amorphous silicon, polycrystalline silicon, microcrystalline silicon, monocrystalline silicon, organic semiconductor material, oxide semiconductor material, other suitable material, or a combination of the above materials.

In this embodiment, the first semiconductor pattern 222 includes two first doped regions 222a and 222c and a first passage region 222b between the two first doped regions 222a and 222c. The second semiconductor pattern 224 includes two second doped regions 224a and 224c and a second passage region 224b between the two second doped regions 224a and 224c. The third semiconductor pattern 226 includes two third doped regions (not shown) and a third passage region (not shown) between the two third doped regions.

In this embodiment, the first semiconductor pattern 222, the second semiconductor pattern 224, and the third semiconductor pattern 226 belong to the same film layer, and the method forming the first semiconductor pattern 222, the second semiconductor pattern 224, and the third semiconductor pattern 226 includes: depositing a semiconductor material layer entirely on the first insulating layer 110, and then patterning the aforementioned first insulating layer 110 through a photolithographic process and an etching process, and finally the doped region and passage region of the semiconductor pattern are defined by doping process. In some embodiments, in response to the semiconductor material layer including amorphous silicon, polycrystalline silicon is optionally formed in the semiconductor material layer by excimer laser annealing (ELA) or other laser processes. In some embodiments, each of the first semiconductor pattern 222, the second semiconductor pattern 224, and the third semiconductor pattern 226 has a thickness of 10 nanometers to 100 nanometers.

The second insulating layer 120 is located above the first insulating layer 110, the first semiconductor pattern 222, the second semiconductor pattern 224, and the third semiconductor pattern 226. The first semiconductor pattern 222, the second semiconductor pattern 224, and the third semiconductor pattern 226 are located between the first insulating layer 110 and the second insulating layer 120. In some embodiments, the material of the second insulating layer 120 includes silicon oxide, silicon nitride, silicon oxynitride, aluminum oxide, zirconium oxide, hafnium oxide, or other suitable materials. In some embodiments, the thickness of the second insulating layer 120 is 30 nanometers to 200 nanometers.

The second conductive layer 230 is located above the second insulating layer 120 and includes a first gate 231, a second gate 232, a third gate 233, a first connection structure 234, a second connection structure 235, and a scanning line 236. In this embodiment, the second gate 232 and the scanning line 236 extend along a first direction D1. The second conductive layer 230 includes a single-layer or multi-layer structure, and the material of the second conductive layer 230 includes, for example, chromium, gold, silver, copper, tin, lead, hafnium, tungsten, molybdenum, neodymium, titanium, tantalum, aluminum, zinc, nickel, alloy or stacked layers of the above metals, or other metal materials. In some embodiments, the method for forming the second conductive layer 230 includes: depositing a second conductive material layer entirely on the second insulating layer 120, and then patterning the aforementioned second conductive material layer through a photolithographic process and an etching process, thereby forming the second conductive layer 230. In some embodiments, the thickness of the second conductive layer 230 is 100 nanometers to 500 nanometers. In some embodiments, the thickness of the second conductive layer 230 is no less than the sum of the thickness of the first insulating layer 110 and the thickness of the first semiconductor pattern 222 (or the second semiconductor pattern 224 or the third semiconductor pattern 226).

In this embodiment, before forming the second conductive layer 230, an opening O5, a first via H1, and a second via H2 are formed through an etching process. The second conductive layer 230 are filled into the opening O5, the first via H1, and the second via H2. Specifically, the opening O5, the first via H1, and the second via H2 run through the first insulating layer 110 and the second insulating layer 120. The opening O5 overlaps a first bottom electrode 212, and the first via H1 and the second via H2 overlap the transfer wire 214. The first gate 231 is filled into the opening O5 to electrically connect to the first bottom electrode 212. The first connection structure 234 and the second connection structure 235 are respectively filled into the first via H1 and the second via H2 to electrically connect to the transfer wire 214.

In this embodiment, the first via H1 overlaps a part of the first semiconductor pattern 222, and the second via H2 overlaps a part of the second semiconductor pattern 224. During the etching process for forming the first via H1 and the second via H2, a part of first semiconductor pattern 222 and part of second semiconductor pattern 224 is used as masks, so that the side wall of the first via H1 and the side wall of the second via H2 have a ladder structure. In this embodiment, the part of the first via H1 above the first semiconductor pattern 222 and the part of the second via H2 above the second semiconductor pattern 224 have a first width W1, another part of the first via H1 below the first semiconductor pattern 222 and another part of the second via H2 below the second semiconductor pattern 224 have a second width W2. The first width W1 is greater than the second width W2.

By configuring the first via H1 and the second via H2 to overlap a part of the first semiconductor pattern 222 and a part of the second semiconductor pattern 224 respectively, the first connection structure 234 electrically connects the first semiconductor pattern 222 to the transfer wire 214 through a single first via H1, and the second connection structure 235 electrically connects the second semiconductor pattern 224 to the transfer wire 214 through a single second via H2. In this embodiment, the first connection structure 234 contacts a part of a top surface and a part of a side surface of the first semiconductor pattern 222, and the second connection structure 235 contacts a part of a top surface and a part of a side surface of the second semiconductor pattern 224.

The first gate 231, the second gate 232, and the third gate 233 overlap the first passage region 222b of the first semiconductor pattern 222, the second passage region 224b of the second semiconductor pattern 224, and the third passage region of the third semiconductor pattern 226, respectively. In this embodiment, the first passage region 222b of the first semiconductor pattern 222 is located between the first gate 231 and the first bottom electrode 212.

The third insulating layer 130 is located above the second conductive layer 230 and the second insulating layer 120, and the second conductive layer 230 is located between the second insulating layer 120 and the third insulating layer 130.

The third conductive layer 240 is located above the third insulating layer 130 and includes a capacitive electrode 242. The capacitive electrode 242 overlaps the first gate 233. In some embodiments, the capacitive electrode 242 is electrically connected to other signal lines (not shown) or other active devices (not shown). The third conductive layer 240 includes a single-layer or multi-layer structure, and the material of the third conductive layer 240 includes, for example, chromium, gold, silver, copper, tin, lead, hafnium, tungsten, molybdenum, neodymium, titanium, tantalum, aluminum, zinc, nickel, alloy or stacked layers of the above metals, or other metal materials. In some embodiments, the method for forming the third conductive layer 240 includes: depositing a third conductive material layer entirely on the third insulating layer 130, and then patterning the aforementioned third conductive material layer through a photolithographic process and an etching process, thereby forming the third conductive layer 240.

The fourth insulating layer 140 is located above the third conductive layer 240 and the third insulating layer 130, and the third conductive layer 240 is located between the third insulating layer 130 and the fourth insulating layer 140.

The fourth conductive layer 250 is located above the third insulating layer 130 and the fourth insulating layer 140 and includes a first source/drain 251, a second source/drain 252, a third source/drain 253, a fourth source/drain 254, a data line 255, and a working voltage line 256. In this embodiment, the first source/drain 251, the second source/drain 252, the third source/drain 253, the fourth source/drain 254, the data line 255, and the working voltage line 256 are all formed on the fourth insulating layer 140. In this embodiment, the data line 255 and the working voltage line 256 extend along a second direction D2. The second direction D2 is not parallel to the first direction D1. The fourth conductive layer 250 includes a single-layer or multi-layer structure, and the material of the fourth conductive layer 250 includes, for example, chromium, gold, silver, copper, tin, lead, hafnium, tungsten, molybdenum, neodymium, titanium, tantalum, aluminum, zinc, nickel, alloy or stacked layers of the above metals, or other metal materials. In some embodiments, the method for forming the fourth conductive layer 250 includes: depositing a fourth conductive material layer entirely on the fourth insulating layer 140, and then patterning the aforementioned fourth conductive material layer through a photolithographic process and an etching process, thereby forming the fourth conductive layer 250.

In this embodiment, before forming the fourth conductive layer 250, openings O1, O2, O3, O4, and O6 are formed through an etching process. The fourth conductive layer 250 is filled into the openings O1, O2, O3, O4, and O6. Specifically, the openings O1, O2, O4, and O6 run through the second insulating layer 120, the third insulating layer 130, and the fourth insulating layer 140. The opening O1 and the opening O2 overlap the third semiconductor pattern 226, the opening O4 overlaps the first semiconductor pattern 222, and the opening O6 overlaps the second semiconductor pattern 226. The opening O3 runs through the third insulating layer 130 and the fourth insulating layer 140. The opening O3 overlaps the first gate 231.

The first source/drain 251 is filled into the opening O4 to electrically connect the working voltage line 256 to the first semiconductor pattern 222. The second source/drain 252 is filled into the opening O6 to electrically connect the second semiconductor pattern 224. The third source/drain 253 is filled into the opening O1 to electrically connect the data line 255 to the third semiconductor pattern 226. The fourth source/drain 254 is filled into the opening O2 and the opening O3 to electrically connect the third semiconductor pattern 226 to the first gate 231.

In this embodiment, a first thin film transistor T1 is formed by the first gate 231, the first bottom gate 212, the first semiconductor pattern 222, the first source/drain 251, and the first connection structure 234. A second thin film transistor T2 is formed by the second gate 232, the second semiconductor pattern 224, the second source/drain 252, and the second connection structure 235. A third thin film transistor T3 is formed by the third gate 233, the third semiconductor pattern 226, the third source/drain 253, and the fourth source/drain 254. In this embodiment, the first thin film transistor T1 is a double gate thin film transistor, and the double gate structure increases the electric current by 30%~50% compared with a top gate structure.

In this embodiment, the first semiconductor pattern 222 is electrically connected to the second semiconductor pattern 224 through the first connection structure 234, the transfer wire 214, and the second connection structure 235, thereby relieving the problem of IR drop after the electric current flows through the first semiconductor pattern 222 and the second semiconductor pattern 224. Specifically, the resistivity of the semiconductor material (the first semiconductor pattern 222 and the second semiconductor pattern 224) is higher than the resistivity of the metal material (the first connection structure 234, the transfer wire 214, and the second connection structure 235). Thus, in response to directly connecting the first semiconductor pattern 222 to the second semiconductor pattern 224 by directly extending the first semiconductor pattern 222 or the second semiconductor pattern 224, the problem of IR drop occurs easily due to the high resistivity. In some embodiments, the transfer wire 214 has a sheet resistance of 0.1 $\Omega/\mu m^2$ to 50 $\Omega/\mu m^2$. In some embodiments, in response to both the first thin film transistor T1 and the second thin film transistor T2 being powered on, the electric current from the first source/drain 251 to the second source/drain 252 is greater than 1 μA (e.g., no less than 10 μA), and the IR drop from the first source/drain 251 to the second source/drain 252 is less than 0.1 volt.

In addition, the amount of insulating layer between the transfer wire 214 and the data line 255 is greater than the amount of insulating layer between the first semiconductor pattern 222 (or the second semiconductor pattern 224) and the data line 255. Thus, by electrically connecting the first semiconductor pattern 222 to the second semiconductor pattern 224 through the first connection structure 234, the transfer wire 214, and the second connection structure 235, the distance between the conductive path from the first semiconductor pattern 222 to the second semiconductor pattern 224 and the data line 255 is increased, thereby relieving the problem of parasitic capacitance.

In addition, designing the transfer wire 214 in the first conductive layer 210 effectively utilizes the circuit layout space, thereby facilitating the design of a high-resolution pixel circuit.

The fifth insulating layer 150 is located above the fourth insulating layer 140 and the fourth conductive layer 250, and the fourth conductive layer 250 is located between the fourth insulating layer 140 and the fifth insulating layer 150.

The fifth conductive layer 260 is located above the fifth insulating layer 150 and includes a first conductive structure 262 and a second conductive structure 264. The fifth conductive layer 260 includes a single-layer or multi-layer structure, and the material of the fifth conductive layer 260 includes, for example, chromium, gold, silver, copper, tin, lead, hafnium, tungsten, molybdenum, neodymium, titanium, tantalum, aluminum, zinc, nickel, alloy or stacked layers of the above metals, or other metal materials. In some embodiments, the method for forming the fifth conductive layer 260 includes: depositing a fifth conductive material layer entirely on the fifth insulating layer 150, and then patterning the aforementioned fifth conductive material layer through a photolithographic process and an etching process, thereby forming the fifth conductive layer 260.

In this embodiment, before forming the fifth conductive layer 260, an opening O7 is formed through an etching process. The fifth conductive layer 260 is filled into the opening O7. Specifically, the opening O7 runs through the fifth insulating layer 150. The opening O7 overlaps the second source/drain 252.

The second conductive structure 264 is filled into the opening O7 to electrically connect to the second source/drain 252.

The sixth insulating layer 160 is located above the fifth insulating layer 150 and the fifth conductive layer 260, and the fifth conductive layer 260 is located between the fifth insulating layer 150 and the sixth insulating layer 160.

The sixth conductive layer 270 is located above the sixth insulating layer 160 and includes a first pad 272 and a second pad 274. The sixth conductive layer 270 includes a single-layer or multi-layer structure, and the material of the sixth conductive layer 270 includes, for example, metal oxides (e.g., indium tin oxide, indium zinc oxide, fluorine-doped indium oxide), metal nitrides (e.g., titanium nitride or molybdenum nitride), or a combination of the above materials. In some embodiments, the method for forming the sixth conductive layer 270 includes: depositing a sixth conductive material layer entirely on the sixth insulating layer 160, and then patterning the aforementioned sixth conductive material layer through a photolithographic process and an etching process, thereby forming the sixth conductive layer 270.

In this embodiment, before forming the sixth conductive layer 270, an opening O8 and an opening O9 are formed through an etching process. The sixth conductive layer 270 is filled into the opening O8 and the opening O9. Specifically, the opening O8 and the opening O9 run through the sixth insulating layer 160 The opening O8 and the opening O9 overlap the second conductive structure 264 and the first conductive structure 262 respectively.

The first pad 272 is filled into the opening O9 to electrically connect to the first conductive structure 262. The second pad 274 is filled into the opening O8 to electrically connect to the second conductive structure 264. The second pad 274 is electrically connected to the second source/drain 252 through the second conductive structure 264.

The light-emitting diode 300 is located above the sixth insulating layer 160 and bonded to the first pad 272 and the second pad 274. In this embodiment, the fifth insulating layer 150, the fifth conductive layer 260, the sixth insulating layer 160, and the sixth conductive layer 270 are included between the light-emitting diode 300 and the fourth conductive layer 250, but the disclosure is not limited thereto. In other embodiments, more insulating layers and conductive layers are included between the light-emitting diode 300 and the fourth conductive layer 250.

The light-emitting diode 300 includes a semiconductor stacking layer 320 and an electrode 310. The semiconductor stacking layer 320 includes stacking layers of N-type semiconductors and P-type semiconductors. In some embodiments, a light-emitting layer is further included between the N-type semiconductors and the P-type semiconductors. Two electrodes 310 are respectively formed on the N-type semiconductor and the P-type semiconductor.

In this embodiment, the electrodes 310 of the light-emitting diode 300 faces the first pad 272 and the second pad 274. In addition, the light-emitting diode 300 is connected to the first pad 272 and the second pad 274 by flip chip bonding through the conductive connection structure 280 (e.g., solder, conductive glue, or other conductive materials), but the disclosure is not limited thereto. In other embodiments, the electrodes 310 of the light-emitting diode 300 face away from the sixth insulating layer 160. In addition, after bonding the light-emitting diode 300 to the sixth insulating layer 160, another conductive connection structure is formed on the electrodes 310 to electrically connect the electrodes 310 to the first pad 272 and the second pad 274. In other embodiments, the electrodes 310 of the light-emitting diode 300 are respectively located on opposite sides of the semiconductor stacking layer 320. In addition, after connecting one of the electrodes 310 of the light-emitting diode 300 to one of the first pad 272 and the second pad 274, another conductive connection structure is formed on another electrode 310 to electrically connect another electrode 310 to the other of the first pad 272 and the second pad 274.

Figure 2A:
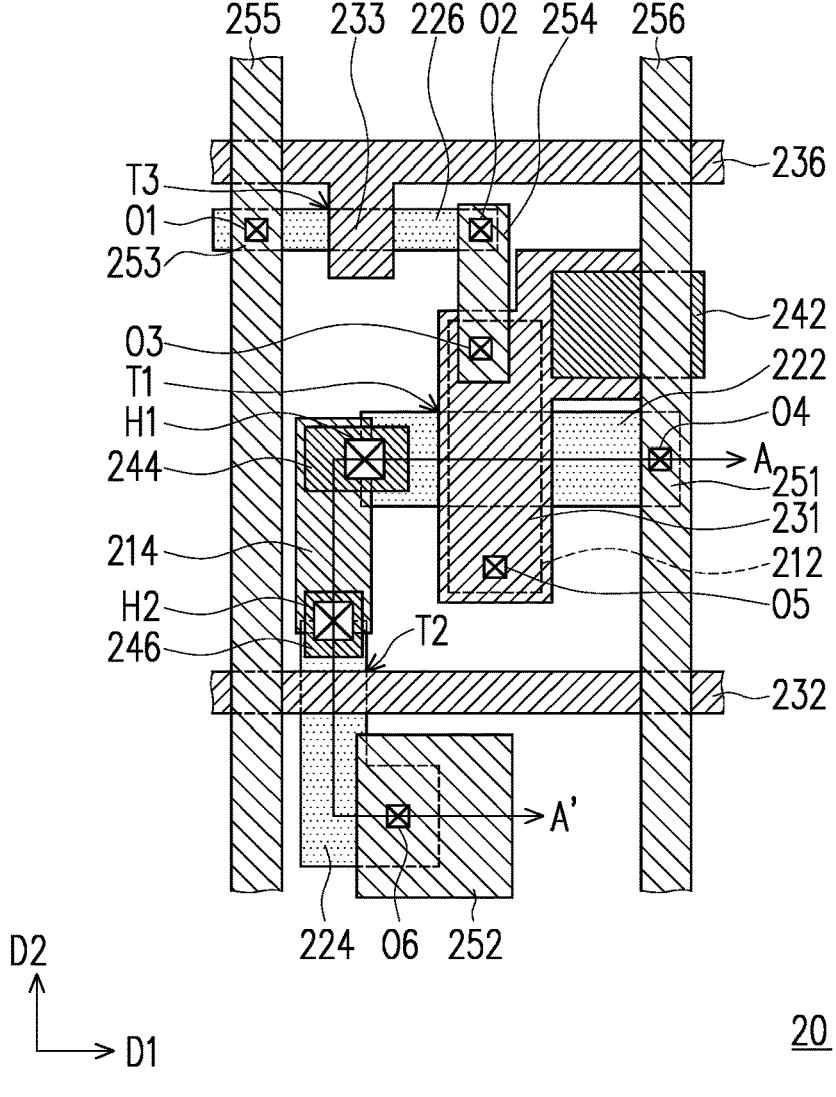
FIG. 2A is a schematic top view of an active device substrate according to an embodiment of the disclosure.
Figure 2B:
FIG. 2B is a cross-sectional schematic view along a line A-A' of FIG. 2A.

FIG. 2A is a schematic top view of an active device substrate 20 according to an embodiment of the disclosure. FIG. 2B is a cross-sectional schematic view along a line A-A' of FIG. 2A. It must be noted here that the element reference numerals and a portion of the contents of the embodiments of FIG. 1A and FIG. 1B are used in the embodiment of FIG. 2A and FIG. 2B, the same or similar reference numerals are used to denote the same or similar elements, and the description of the same technical content is omitted. For the description of the omitted portion, reference may be made to the foregoing embodiment, and details are not described herein.

The difference between the active device substrate 20 in FIG. 2A and FIG. 2B and the active device substrate 10 in FIG. 1A and FIG. 1B is that: in the active device substrate 10, the first connection structure 234 and the second connection structure 235 belong to the second conductive layer 230. However, in the active device substrate 20, the first connection structure 244 and the second connection structure 246 belong to the third conductive layer 240.

Referring to FIG. 2A and FIG. 2B, the first conductive layer 210 is located between the substrate 100 and the first insulating layer 110 and includes a first bottom electrode 212 and a transfer wire 214. The second conductive layer 230 is located between the second insulating layer 120 and the third insulating layer 130 and includes a first gate 231, a second gate 232, a third gate 233, and a scanning line 236. The third conductive layer 240 is located between the third insulating layer 130 and the fourth insulating layer 140 and includes a capacitive electrode 242, a first connection structure 244, and a second connection structure 246. The fourth conductive layer 250 is located between the fourth insulating layer 140 and the fifth insulating layer 150 and includes a first source/drain 251, a second source/drain 252, a third source/drain 253, a fourth source/drain 254, a data line 255, and a working voltage line 256. The fifth conductive layer 260 is located between the fifth insulating layer 150 and the sixth insulating layer 160 and includes a first conductive structure 262 and a second conductive structure 264. The sixth conductive layer 270 is located on the sixth insulating layer 160 and includes a first pad 272 and a second pad 274.

In this embodiment, after forming the second conductive layer 230, the second conductive layer 230 is used as a mask to perform a doping process on the first semiconductor pattern 222, the second semiconductor pattern 224, and the third semiconductor pattern 226 to define the doped region and the passage region. The first passage region 222b of the first semiconductor pattern 222, the second passage region 224b of the second semiconductor pattern 224, and the third passage region of the third semiconductor pattern 226 are all overlapped on the second conductive layer 230. Since the second conductive layer 230 does not cover the first doped region 222c and the second doped region 224a, it is ensured that the portion of the first semiconductor pattern 222 contacting the first connection structure 244 and the portion of the second semiconductor pattern 224 contacting the second connection structure 246 are doped in the aforementioned doping process.

In this embodiment, before forming the third conductive layer 240, a first via H1 and a second via H2 are formed through an etching process. The third conductive layer 240 is filled in the first via H1 and the second via H2. Specifically, the first via H1 and the second via H2 run through the first insulating layer 110, the second insulating layer 120, and the third insulating layer 130. The first via H1 and the second via H2 overlap the transfer wire 214. The first connection structure 244 and the second connection structure 246 are respectively filled into the first via H1 and the second via H2 to electrically connect to the transfer wire 214.

In this embodiment, the part of the first via H1 above the first semiconductor pattern 222 and the part of the second via H2 above the second semiconductor pattern 224 have a first width W1, another part of the first via H1 below the first semiconductor pattern 222 and another part of the second via H2 below the second semiconductor pattern 224 have a second width W2. The first width W1 is greater than the second width W2.

By configuring the first via H1 and the second via H2 to overlap a part of the first semiconductor pattern 222 and a part of the second semiconductor pattern 224 respectively, the first connection structure 244 electrically connects the first semiconductor pattern 222 to the transfer wire 214 through a single first via H1, and the second connection structure 246 electrically connects the second semiconductor pattern 224 to the transfer wire 214 through a single second via H2. In this embodiment, the first connection structure 244 contacts a part of a top surface and a part of a side surface of the first semiconductor pattern 222, and the second connection structure 246 contacts a part of a top surface and a part of a side surface of the second semiconductor pattern 224.

Figure 3A:
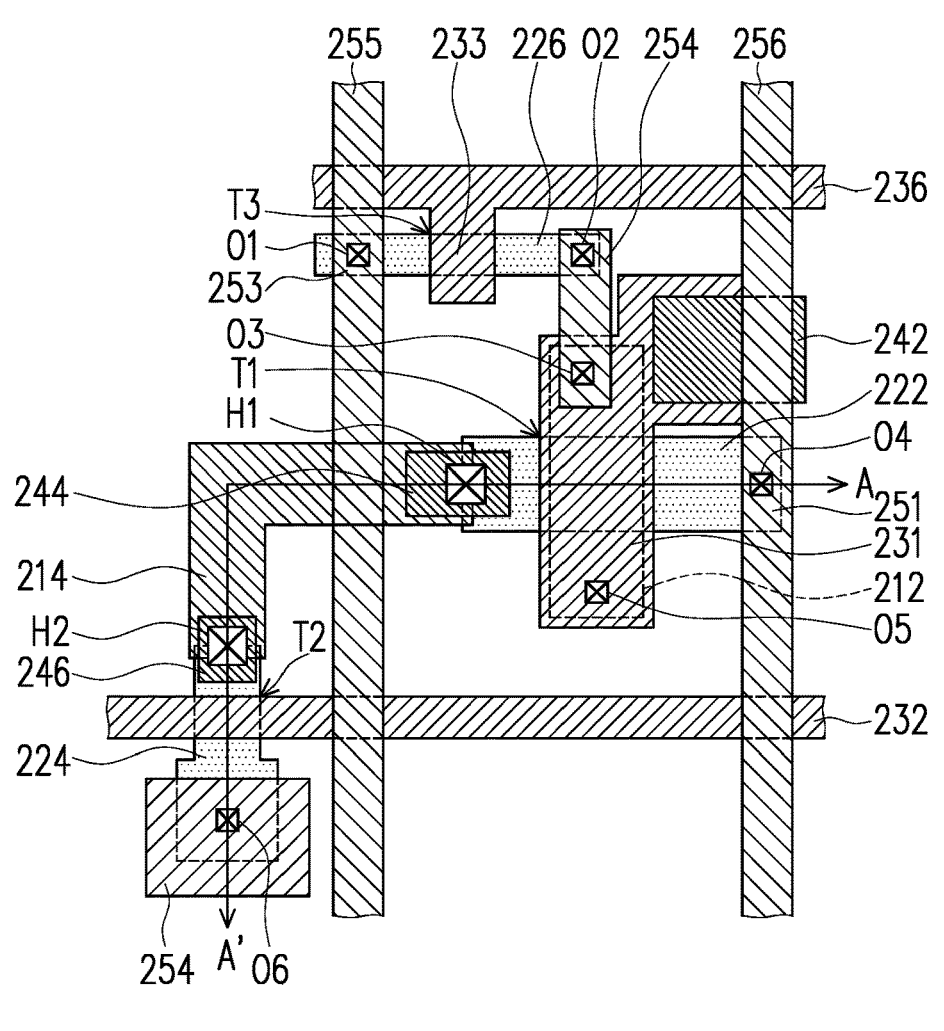
FIG. 3A is a schematic top view of an active device substrate according to an embodiment of the disclosure.
Figure 3A:
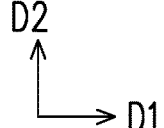
Figure 3B:
FIG. 3B is a cross-sectional schematic view along a line A-A' of FIG. 3A.

FIG. 3A is a schematic top view of an active device substrate 30 according to an embodiment of the disclosure. FIG. 3B is a cross-sectional schematic view along a line A-A' of FIG. 3A. It must be noted here that the element reference numerals and a portion of the contents of the embodiments of FIG. 2A and FIG. 2B are used in the embodiment of FIG. 3A and FIG. 3B, the same or similar reference numerals are used to denote the same or similar elements, and the description of the same technical content is omitted. For the description of the omitted portion, reference may be made to the foregoing embodiment, and details are not described herein.

The difference between the active device substrate 30 in FIG. 3A and FIG. 3B and the active device substrate 20 in FIG. 2A and FIG. 2B is that: the transfer wire 214 of the active device substrate 20 extends below the data line 255.

Referring to FIG. 3A and FIG. 3B, in this embodiment, since the transfer wire 214 belongs to the first conductive layer 210, the circuit layout space is utilized more effectively, thereby facilitating the design of a high-resolution pixel circuit. For example, the data line 255 is disposed above the transfer wire 214, so that the data line 255 partially overlaps the transfer wire 214.

Although in this embodiment, the first connection structure 244 and the second connection structure 246 belong to the third conductive layer 240, the disclosure is not limited thereto. In other embodiments, the first connection structure and the second connection structure belong to the second conductive layer 230.

Figure 4A:
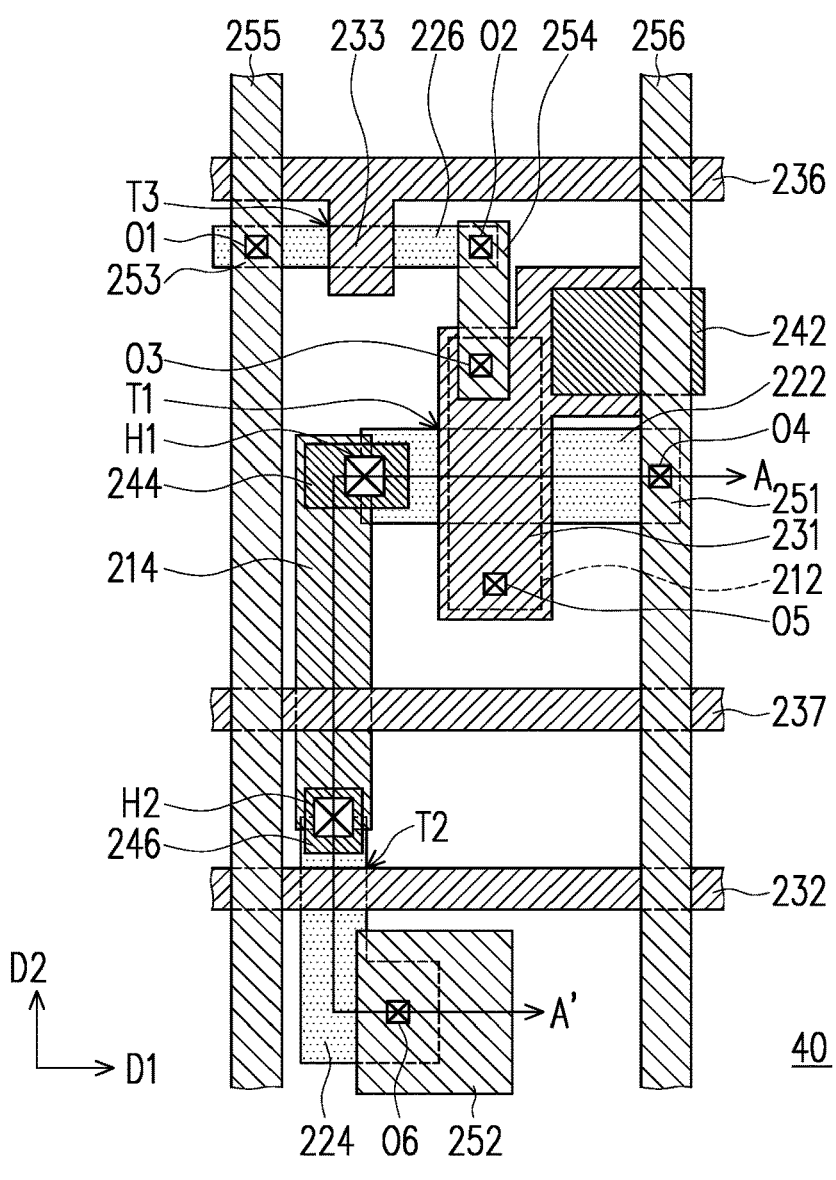
FIG. 4A is a schematic top view of an active device substrate according to an embodiment of the disclosure.
Figure 4B:
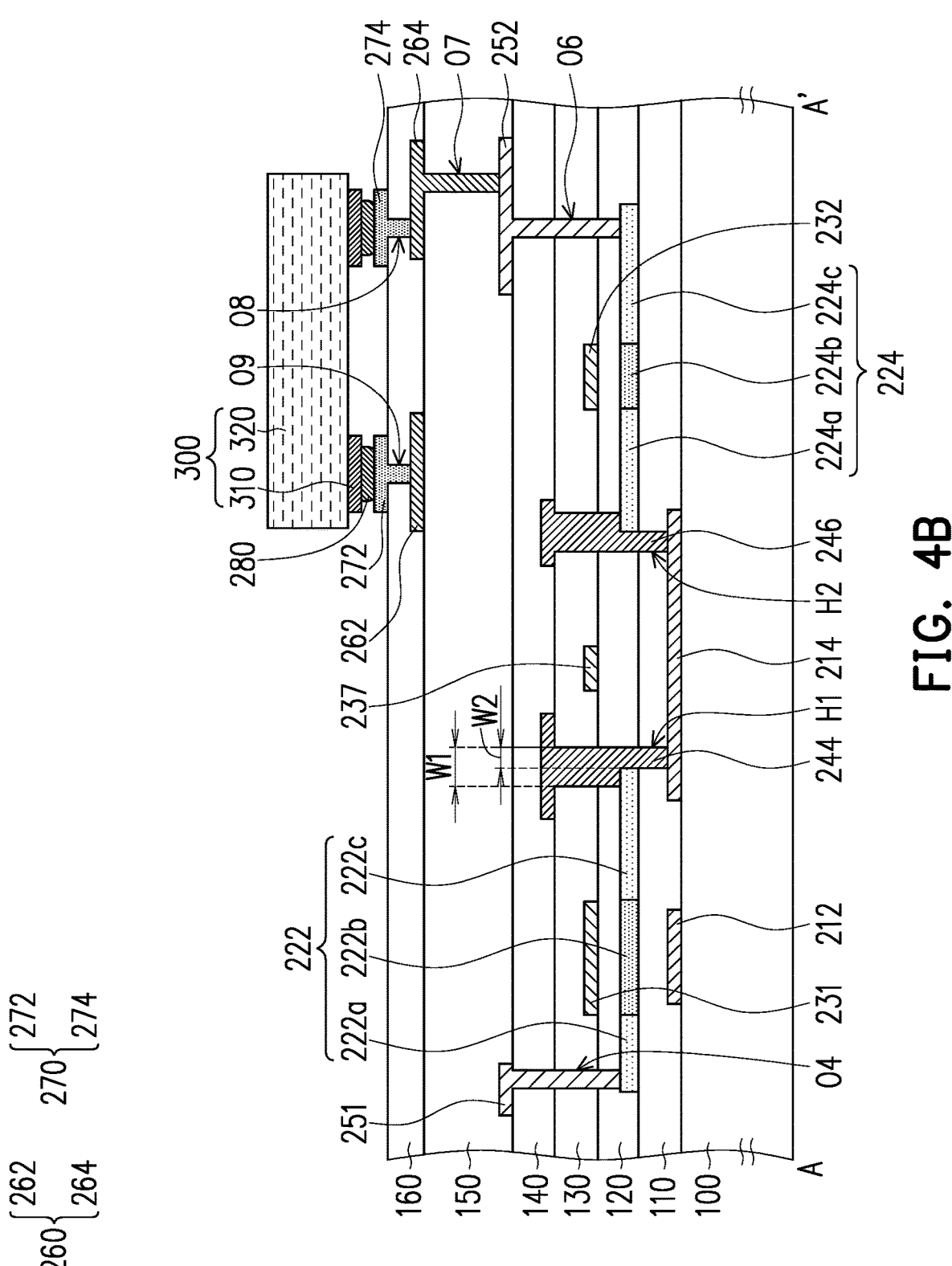
FIG. 4B is a cross-sectional schematic view along a line A-A' of FIG. 4A.

FIG. 4A is a schematic top view of an active device substrate 40 according to an embodiment of the disclosure. FIG. 4B is a cross-sectional schematic view along a line A-A' of FIG. 4A. It must be noted here that the element reference numerals and a portion of the contents of the embodiments of FIG. 2A and FIG. 2B are used in the embodiment of FIG. 4A and FIG. 4B, the same or similar reference numerals are used to denote the same or similar elements, and the description of the same technical content is omitted. For the description of the omitted portion, reference may be made to the foregoing embodiment, and details are not described herein.

The difference between the active device substrate 40 in FIG. 4A and FIG. 4B and the active device substrate 20 in FIG. 2A and FIG. 2B is that: the second conductive layer 230 of the active device substrate 20 further includes a signal line 237.

Referring to FIG. 4A and FIG. 4B, the second gate 232, the scanning line 236, and the signal line 237 extend along a first direction D1. The transfer wire 214 extends below the signal line 237. In this embodiment, since the transfer wire

214 belongs to the first conductive layer 210, the circuit layout space is utilized more effectively, thereby facilitating the design of a high-resolution pixel circuit. For example, the signal line 237 is disposed above the transfer wire 214, so that the signal line 237 partially overlaps the transfer wire 214. In this embodiment, the signal line 237 is located between the first connection structure 244 and the second connection structure 246.

Although in this embodiment, the first connection structure 244 and the second connection structure 246 belong to the third conductive layer 240, the disclosure is not limited thereto. In other embodiments, the first connection structure and the second connection structure belong to the second conductive layer 230, and the signal line 237 is located between the first connection structure and the second connection structure.

Figure 5:
FIG. 5 is a schematic cross-sectional view of an active device substrate according to an embodiment of the disclosure.

FIG. 5 is a schematic cross-sectional view of an active device 50 substrate according to an embodiment of the disclosure. It must be noted here that the element reference numerals and a portion of the contents of the embodiments of FIG. 1A and FIG. 1B are used in the embodiment of FIG. 5, the same or similar reference numerals are used to denote the same or similar elements, and the description of the same technical content is omitted. For the description of the omitted part, reference may be made to the foregoing embodiment, and details are not described herein.

The difference between the active device substrate 50 in FIG. 5 and the active device substrate 10 in FIG. 1A and FIG. 1B is that: the first conductive layer 210 of the active device substrate 50 further includes a second bottom gate 216.

Referring to FIG. 5, the second passage region 224b of the second semiconductor pattern 224 is located between the second gate 232 and the second bottom gate 216. In this embodiment, the first thin film transistor T1 and the second thin film transistor T2 are double gate thin film transistors, and the double gate structure increases the electric current by 30%~50% compared with a top gate structure.

Figure 6A:
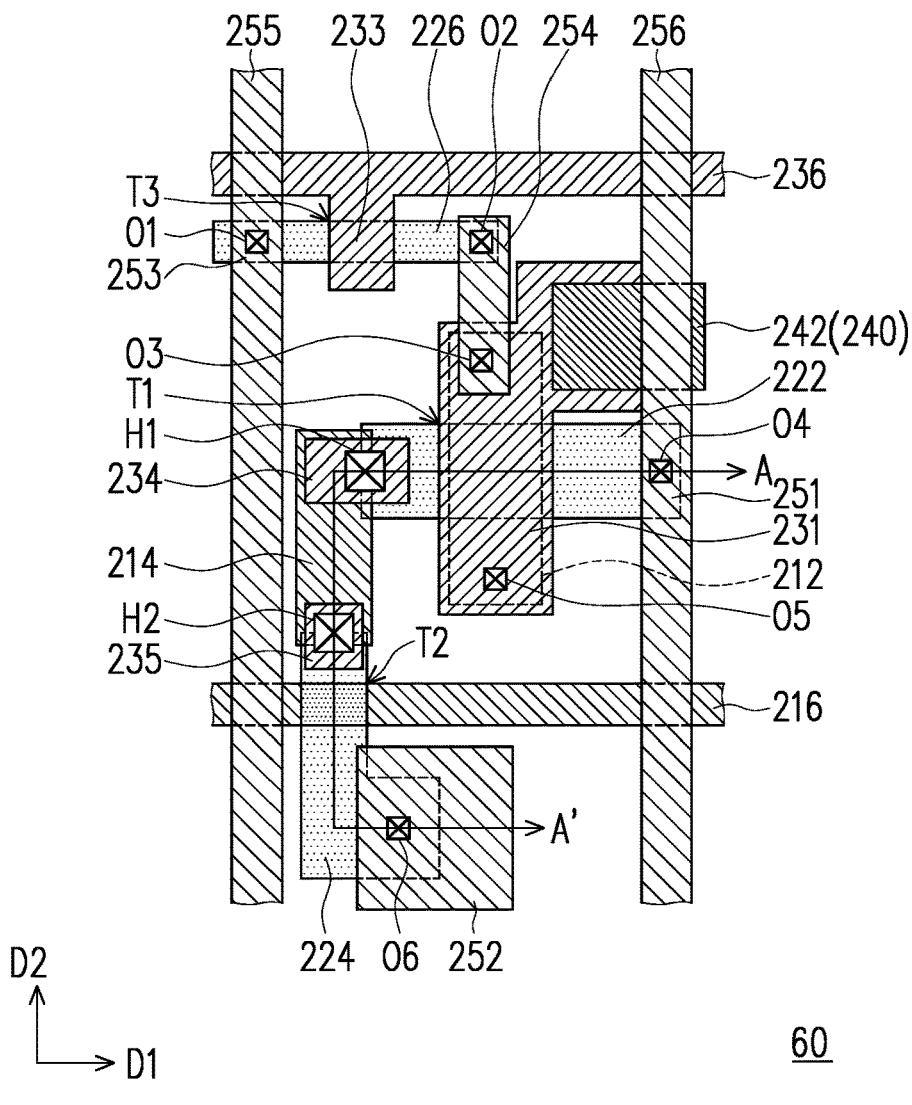
FIG. 6A is a schematic top view of an active device substrate according to an embodiment of the disclosure.
Figure 6B:
FIG. 6B is a cross-sectional schematic view along a line A-A' of FIG. 6A.

FIG. 6A is a schematic top view of an active device substrate 60 according to an embodiment of the disclosure. FIG. 6B is a cross-sectional schematic view along a line A-A' of FIG. 6A. It is noted that the embodiment of FIG. 6A and FIG. 6B uses the reference numerals and a part of the contents of the embodiment of FIG. 5, and the same or similar reference numerals are used to denote the same or similar elements, and the description of the same technical content is omitted. For the description of the omitted portion, reference may be made to the foregoing embodiment, and details are not described herein.

The difference between the active device substrate 60 in FIG. 6A and FIG. 6B and the active device substrate 50 in FIG. 5 is that: the second thin film transistor T2 of the active device substrate 60 is a bottom gate type thin film transistor.

Referring to FIG. 6A and FIG. 6B, in this embodiment, the first conductive layer 210 includes a second bottom gate 216 (also directly referred to as a second gate), and the second conductive layer 230 does not include a second gate.

Figure 7:
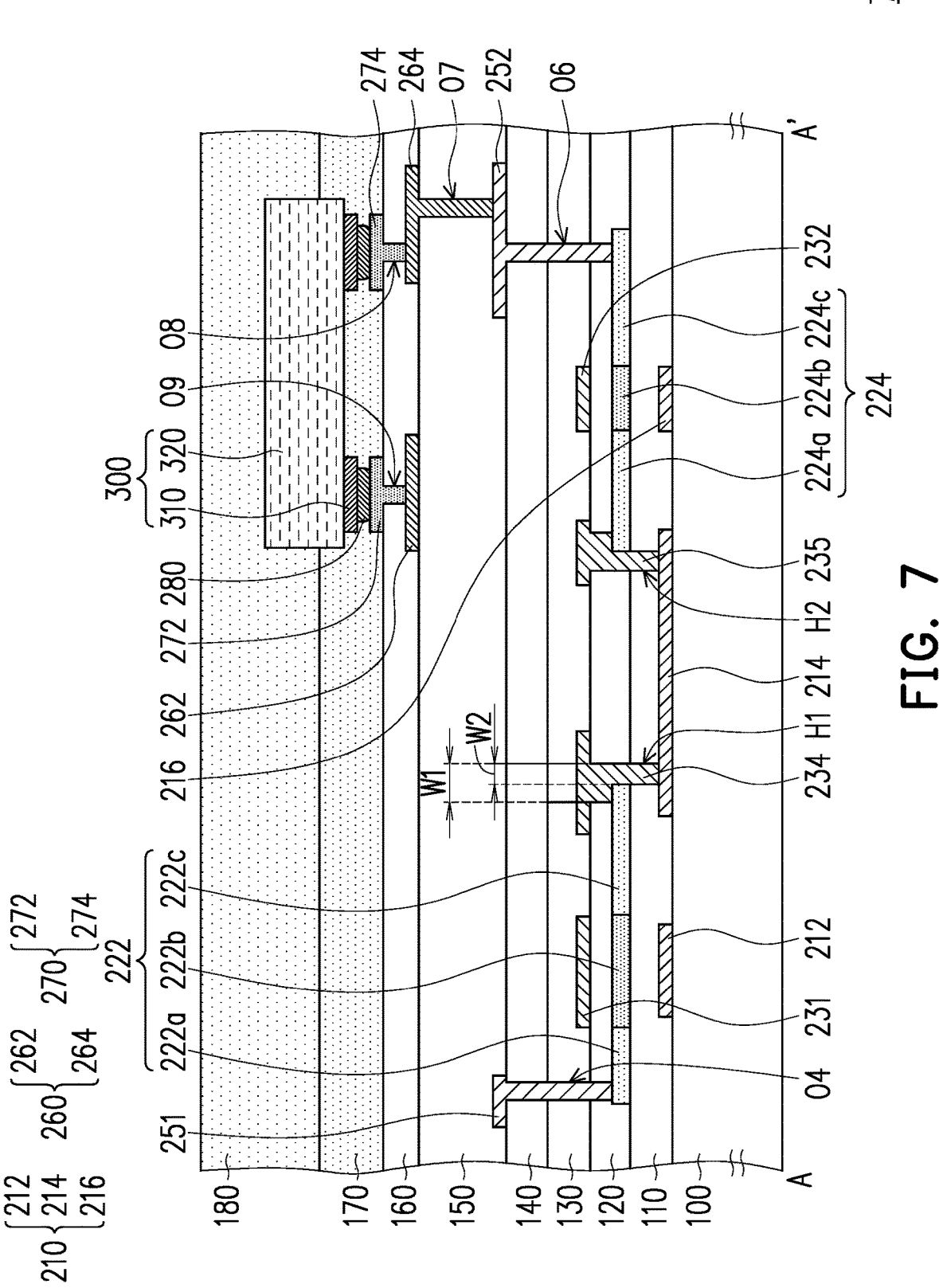
FIG. 7 is a schematic cross-sectional view of an active device substrate according to an embodiment of the disclosure.

FIG. 7 is a schematic cross-sectional view of an active device 70 substrate according to an embodiment of the disclosure. It must be noted here that the element reference numerals and a portion of the contents of the embodiments of FIG. 1A and FIG. 1B are used in the embodiment of FIG. 7, the same or similar reference numerals are used to denote the same or similar elements, and the description of the same technical content is omitted. For the description of the omitted portion, reference may be made to the foregoing embodiment, and details are not described herein.

The difference between the active device substrate 70 in FIG. 7 and the active device substrate 10 in FIG. 1A and FIG. 1B is that: the active device substrate 70 further includes a protective layer 170 and an encapsulation layer 180.

Referring to FIG. 7, the protective layer 170 surrounds a connection point between the electrodes 310 of the light-emitting diode 300 and the first pad 272 and a connection point between the electrodes 310 and the second pad 274. For example, the protective layer 170 surrounds the conductive connection structure 280. In some embodiments, the protective layer 170 includes a black material. The encapsulation layer 180 is located on the protective layer 170 and the light-emitting diode 300.

Figure 8:
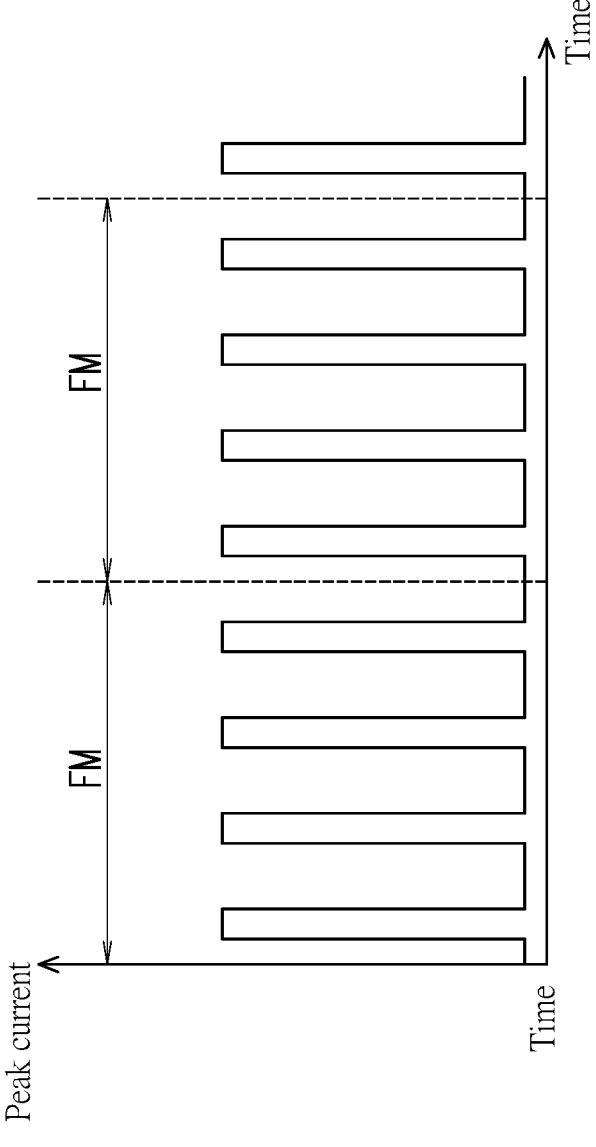
FIG. 8 is a signal waveform diagram of a second thin film transistor of an active device substrate according to an embodiment of disclosure.

FIG. 8 is a signal waveform diagram of a second thin film transistor of an active device substrate according to an embodiment of disclosure. In this embodiment, the structure of the active device substrate may refer to any embodiment in FIG. 1A to FIG. 7. The active device substrate 10 shown in FIG. 1A and FIG. 1B is taken as an example for description below.

Generally, the operating electric current (greater than 1 μA) and the luminance of inorganic light-emitting diodes are significantly greater than the operating electric current (less than 0.1 μA) and the luminance of organic light-emitting diodes. The red inorganic light-emitting diode, in particular, requires an instantaneous current greater than 40 μA. In order to prevent the luminance of the display screen of the inorganic light-emitting diode display apparatus from being too high, it is necessary to reduce the light-emitting time of the inorganic light-emitting diode in a light-emitting cycle. Specifically, the light-emitting time of organic light-emitting diodes has a high proportion in a light-emitting cycle, but the light-emitting time of inorganic light-emitting diodes has a low proportion in a light-emitting cycle.

Referring to FIG. 1A, FIG. 1B, and FIG. 8, by disposing the second thin film transistor T2, the light-emitting time of the light-emitting diode 300 is controlled by a pulse signal, thereby shortening the proportion of the light-emitting time of the light-emitting diode 300 within a light-emitting cycle FM. Specifically, within a light-emitting cycle FM (i.e., within the time of turning on the first thin film transistor T1 once and turning off the first thin film transistor T1 once), repeat turning on and off the second thin film transistor T2 multiple times. In this way, the light-emitting time of the light-emitting diode 300 is shortened, thereby avoiding the problem of the luminance of the display screen being too high. The electric current signal flowing through the second thin film transistor T2 is shown in FIG. 8.

To sum up, the first semiconductor pattern is electrically connected to the second semiconductor pattern through the first connection structure, the transfer wire, and the second connection structure, thereby relieving the problem of IR drop after the electric current flows through the first semiconductor pattern and the second semiconductor pattern. In addition, since a relatively far distance is provided between the transfer wire and the data line, the problem of parasitic capacitance is reduced by electrically connecting the first semiconductor pattern to the second semiconductor pattern through the first connection structure, the transfer wire, and the second connection structure.

What is claimed is:

1. An active device substrate, comprising:
   a first conductive layer located above a substrate, wherein the first conductive layer comprises a transfer wire and a first bottom gate, and the transfer wire is physically separated from the first bottom gate;

a first insulating layer, located above the first conductive layer;

a second insulating layer, located above the first insulating layer;

a first semiconductor pattern and a second semiconductor pattern, located between the first insulating layer and the second insulating layer;

a first connection structure and a second connection structure, located above the second insulating layer and respectively filled into a first via and a second via that run through the first insulating layer and the second insulating layer to electrically connect to the transfer wire, wherein the first semiconductor pattern, the first connection structure, the transfer wire, the second connection structure, and the second semiconductor pattern are connected in sequence;

a first gate and a second gate, respectively overlapping the first semiconductor pattern and the second semiconductor pattern, wherein the first semiconductor pattern is located between the first bottom gate and the first gate, the first semiconductor pattern is physically connected to the first connection structure, the first connection structure is physically connected to the transfer wire, the transfer wire is physically connected to the second connection structure, and the second connection structure is physically connected to the second semiconductor pattern;

a third insulating layer, located on the first connection structure, the second connection structure, and the second insulating layer;

a first source/drain and a second source/drain, located above the third insulating layer and electrically connected to the first semiconductor pattern and the second semiconductor pattern, respectively;

further comprises:

a second conductive layer, located between the second insulating layer and the third insulating layer and comprising the first gate and the second gate;

a fourth insulating layer, located above the third insulating layer;

a third conductive layer, located between the third insulating layer and the fourth insulating layer and comprising a capacitive electrode, the first connection structure, and the second connection structure, wherein the capacitive electrode overlaps the first gate; and a fourth conductive layer, located above the fourth insulating layer and comprising the first source/drain and the second source/drain;

a third semiconductor pattern, located between the first insulating layer and the second insulating layer;

wherein the second conductive layer further comprises:

a scanning line and a signal line, extending along a first direction, wherein the signal line partially overlaps the transfer wire and is located between the first connection structure and the second connection structure; and a third gate, electrically connected to the scanning line and overlapping the third semiconductor pattern;

wherein the fourth conductive layer further comprises:

a data line, extending along a second direction and electrically connected to the third semiconductor pattern.

2. The active device substrate according to claim 1, further comprises:

a second conductive layer, located between the second insulating layer and the third insulating layer and comprising the first gate, the second gate, the first connection structure, and the second connection structure;

a fourth insulating layer, located above the third insulating layer;

a third conductive layer, located between the third insulating layer and the fourth insulating layer and comprising a capacitive electrode, wherein the capacitive electrode overlaps the first gate; and a fourth conductive layer, located above the fourth insulating layer and comprising the first source/drain and the second source/drain.

3. The active device substrate according to claim 2, further comprises:

a third semiconductor pattern, located between the first insulating layer and the second insulating layer;

wherein the second conductive layer further comprises:

a scanning line and a signal line, extending along a first direction, wherein the signal line partially overlaps the transfer wire and is located between the first connection structure and the second connection structure; and a third gate, electrically connected to the scanning line and overlapping the third semiconductor pattern;

wherein the fourth conductive layer further comprises:

a data line, extending along a second direction and electrically connected to the third semiconductor pattern.

4. The active device substrate according to claim 2, further comprises:

a third semiconductor pattern, located between the first insulating layer and the second insulating layer;

wherein the second conductive layer further comprises:

a scanning line, extending along a first direction; and a third gate, electrically connected to the scanning line and overlapping the third semiconductor pattern;

wherein the fourth conductive layer further comprises:

a data line, extending along a second direction, wherein the data line partially overlaps the transfer wire and electrically connects to the third semiconductor pattern.

5. The active device substrate according to claim 1, further comprises:

a third semiconductor pattern, located between the first insulating layer and the second insulating layer;

wherein the second conductive layer further comprises:

a scanning line; and a third gate, electrically connected to the scanning line and overlapping the third semiconductor pattern;

wherein the fourth conductive layer further comprises:

a data line, extending along a second direction, wherein the data line partially overlaps the transfer wire and electrically connects to the third semiconductor pattern.

6. The active device substrate according to claim 1, wherein the first semiconductor pattern comprises two first doped regions and a first passage region located between the first doped regions and the second semiconductor pattern comprises two second doped regions and a second passage region located between the second doped regions, wherein the first passage region and the second passage region overlap the second conductive layer.

7. The active device substrate according to claim 1 wherein the first connection structure physically contacts a part of a top surface and a part of a side surface of the first semiconductor pattern, and the second connection structure physically contacts a part of a top surface and a part of a side surface of the second semiconductor pattern, and the first via and the second via are overlapped with the transfer wire.

8. The active device substrate according to claim 1, further comprises:

a working voltage line, electrically connected to the first source/drain;

a pad, electrically connected to the second source/drain;

a light-emitting diode, coupled to the pad; and a protective layer, surrounding a connection point between the light-emitting diode and the pad.

9. The active device substrate according to claim 8, wherein the protective layer comprises a black material.

\* \* \* \* \*